(12) United States Patent
Kuo et al.

(10) Patent No.: US 10,803,278 B2
(45) Date of Patent: Oct. 13, 2020

(54) PANEL STRUCTURE

(71) Applicant: Reco Technology (Chengdu) Co., Ltd., Sichuan (CN)

(72) Inventors: Yu-Pi Kuo, Guangdong (CN);
Chung-Wu Liu, Guangdong (CN);
Chun-Te Chang, Guangdong (CN);
Sin-Cheng Lin, Guangdong (CN);
Wan-Heng Lin, Guangdong (CN);
Shih-Chieh Huang, Guangdong (CN)

(73) Assignee: RECO TECHNOLOGY (CHENGDU) CO., LTD., Sichuan (CN)

( * ) Notice: Subject to any disclaimer, the term of this patent is extended or adjusted under 35 U.S.C. 154(b) by 90 days.

(21) Appl. No.: 16/053,785

(22) Filed: Aug. 2, 2018

(65) Prior Publication Data

US 2019/0370519 A1    Dec. 5, 2019

(30) Foreign Application Priority Data

May 31, 2018  (CN) .......................... 2018 1 0549328

(51) Int. Cl.
| | |
|---|---|
| *G06K 9/00* | (2006.01) |
| *B06B 1/06* | (2006.01) |
| *H01L 27/32* | (2006.01) |
| *H01L 51/52* | (2006.01) |
| *H01L 41/09* | (2006.01) |
| *H01L 41/04* | (2006.01) |
| *H01L 41/113* | (2006.01) |
| *H01L 41/18* | (2006.01) |

(52) U.S. Cl.
CPC .......... *G06K 9/0002* (2013.01); *B06B 1/0644* (2013.01); *H01L 27/3225* (2013.01); *H01L 41/042* (2013.01); *H01L 41/09* (2013.01); *H01L 41/1132* (2013.01); *H01L 51/5284* (2013.01); *H01L 41/18* (2013.01)

(58) Field of Classification Search
CPC . B06B 1/0284; B06B 1/0644; B06B 2201/70; G06F 3/0414; G06K 9/0002; H01L 27/3225; H01L 41/042; H01L 41/09; H01L 41/1132; H01L 41/18; H01L 51/5284; H04M 1/026; H04M 1/0266; H04M 2250/12
See application file for complete search history.

(56) References Cited

U.S. PATENT DOCUMENTS

| | | | |
|---|---|---|---|
| 9,100,755 B2 * | 8/2015 | Takeda .................... | H04R 17/10 |
| 2014/0354596 A1 * | 12/2014 | Djordjev ................ | G06F 3/0421 |
| | | | 345/175 |
| 2018/0211085 A1 * | 7/2018 | Liu ........................ | G06K 9/0004 |

(Continued)

*Primary Examiner* — Bobbak Safaipour
(74) *Attorney, Agent, or Firm* — CKC & Partners Co., LLC

(57) ABSTRACT

Panel structure includes a substrate, a piezoelectric material layer and a thin film transistor. The piezoelectric material layer is disposed under the substrate, in which the piezoelectric material layer is configured to generate human recognizable sound waves by vibrating at a human audible frequency in a first time interval, and the piezoelectric material layer is configured to generate ultrasonic waves by vibrating at an ultrasonic frequency in a second time interval. The piezoelectric material layer is used for recognizing human fingerprints when it vibrates at the ultrasonic frequency. The thin film transistor is positioned under and electrically connected to the piezoelectric material layer.

10 Claims, 3 Drawing Sheets

(56) References Cited

U.S. PATENT DOCUMENTS

| 2019/0095015 A1* | 3/2019 | Han | G06F 3/0412 |
| 2020/0171540 A1* | 6/2020 | Han | H04R 9/06 |
| 2020/0184176 A1* | 6/2020 | Liu | G06K 9/0002 |

* cited by examiner

PANEL STRUCTURE

CROSS-REFERENCE TO RELATED APPLICATION

This application claims priority to Chinese Application Serial Number 201810549328.7, filed May 31, 2018, which is herein incorporated by reference in its entirety.

BACKGROUND

Field of Invention

The present invention relates to a panel structure.

Description of Related Art

In the field of smart phones, fingerprint recognition has been one of the major biometric manners. However, an area specifically for the fingerprint recognition is necessary due to the characteristic of the fingerprint recognition device, resulting in a decrease in the display area of the panel.

On the other hand, the configuration and volume of each device becomes more important in recent years because of the design trend of narrow border phones. Nevertheless, the above-mentioned fingerprint recognition issue would affect the configuration of the display area. Besides, an earpiece of the smart phone is unable to be configured in the display area, which is also a barrier of the development in the narrow border phones.

SUMMARY

The invention provides a panel structure including a cover plate, a piezoelectric material layer and a thin-film transistor. The piezoelectric material layer is disposed under the cover plate, in which the piezoelectric material layer is configured to vibrate at a human audible frequency in a first time interval to generate a sound wave that human can recognize, and the piezoelectric material layer is configured to vibrate at a ultrasonic frequency in a second time interval to generate a ultrasonic wave, and the piezoelectric material layer is used for recognizing human fingerprint when vibrating at the ultrasonic frequency. The thin-film transistor is disposed under the piezoelectric material layer, in which the thin-film transistor is electrically connected to the piezoelectric material layer.

In accordance with an embodiment of the panel structure of the present disclosure, the panel structure includes an ink layer disposed between the cover plate and the piezoelectric material layer.

In accordance with an embodiment of the panel structure of the present disclosure, the panel structure includes a display layer disposed between the cover plate and the piezoelectric material layer.

In accordance with an embodiment of the panel structure of the present disclosure, the display layer is an organic light-emitting diode.

In accordance with an embodiment of the panel structure of the present disclosure, the panel structure includes a black matrix layer disposed between the display layer and the cover plate.

In accordance with an embodiment of the panel structure of the present disclosure, the panel structure includes a power supply device configured to supply an electric power to the piezoelectric material layer.

In accordance with an embodiment of the panel structure of the present disclosure, the power supply device is an alternating-current power supply device.

In accordance with an embodiment of the panel structure of the present disclosure, a frequency of the electric power is equal to the human audible frequency or the ultrasonic frequency.

In accordance with an embodiment of the panel structure of the present disclosure, the panel structure includes a substrate, in which the cover plate, the piezoelectric material layer and the thin-film transistor are disposed on the substrate.

In accordance with an embodiment of the panel structure of the present disclosure, when the piezoelectric material layer vibrates at the ultrasonic frequency, the piezoelectric material layer is configured to be an emitter and a receiver of the ultrasonic wave.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
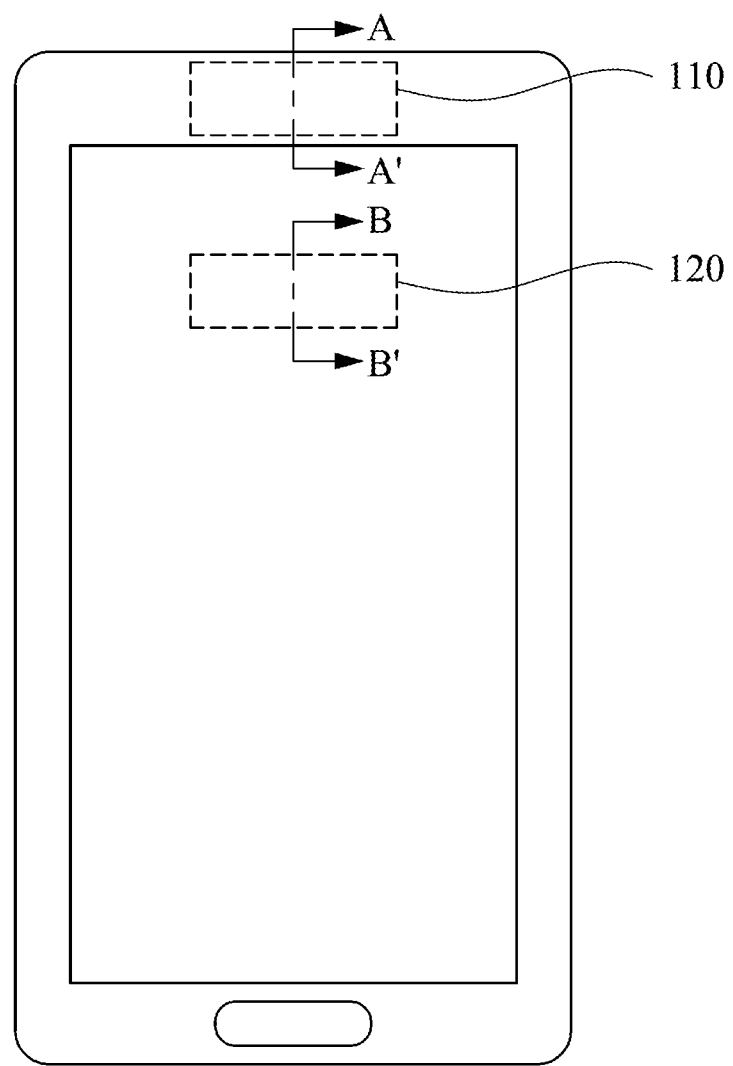
FIG. 1 is a top view of a smart phone 100 according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features are disposed between the first and second features, such that the first and second features are not in direct contact. For the purpose of simplicity and clarity, different features may be depicted with different sizes.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Reference will now be made in detail to the present embodiments of the invention, examples of which are illustrated in the accompanying drawings. Wherever possible, the same reference numbers are used in the drawings and the description to refer to the same or like parts.

Please refer to FIG. 1, which illustrates a top view of a smart phone 100 according to some embodiments of the present disclosure. The smart phone 100 includes a display area and a non-display area. In some embodiments, a fingerprint recognition area may be in the display area, such as fingerprint recognition area 120, or in the non-display area, such as fingerprint recognition area 110. The fingerprint recognition area 110 and 120 have not only a function of fingerprint recognition but also a function of producing a sound wave that human can recognize, thus the fingerprint recognition area 110 and 120 may be used as the earpieces in conventional phones.

Figure 2:
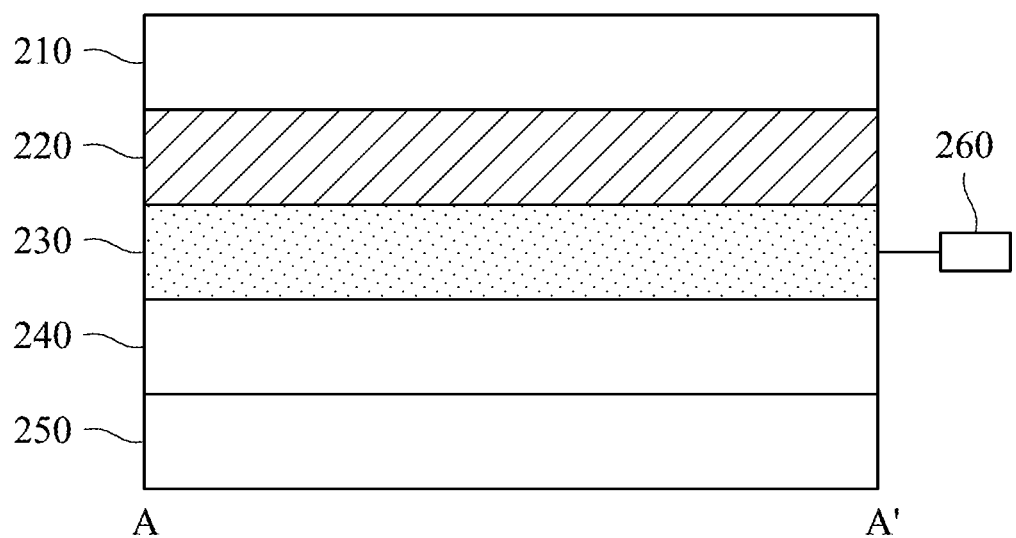
FIG. 2 is a cross-sectional view illustrating a panel structure 200 of the fingerprint recognition area 110 along a line A-A' in FIG. 1.

FIG. 2 is a cross-sectional view illustrating a panel structure 200 of the fingerprint recognition area 110 along a line A-A' in FIG. 1. The panel structure 200 includes a cover plate 210, a piezoelectric material layer 230 and a thin-film transistor 240. The piezoelectric material layer 230 is disposed beneath the cover plate 210, and the thin-film transistor 240 is disposed under the piezoelectric material layer 230. The cover plate 210 may be a glass plate, for example. The piezoelectric material layer 230, for example, may be a layer of lead zirconate titanate, polyvinylidene fluoride, and/or aluminum nitride, or a piezoelectric copolymer layer. In some embodiments, the thin-film transistor 240 is electrically connected to the piezoelectric material layer 230. The thin-film transistor 240 is used for analyzing the received signal when the piezoelectric material layer 230 operates as a fingerprint recognition device.

When the piezoelectric material layer 230 is powered by electricity, the piezoelectric material layer 230 would deform. Therefore, when an alternating current with a certain frequency is supplied, the piezoelectric material layer 230 can generate a wave having a corresponding frequency. When the piezoelectric material layer 230 vibrates at a human audible frequency in a time interval, the piezoelectric material layer 230 may generate the sound wave that human can recognize, according to some embodiments of the present disclosure. The human audible frequency is ranged from 20 Hz to 20,000 Hz. When the piezoelectric material layer 230 vibrates at an ultrasonic frequency in another time interval, the piezoelectric material layer 230 may generate the sound wave used for fingerprint recognition, in which the ultrasonic frequency is greater than 20,000 Hz.

In certain embodiments, the panel structure 200 may include a power supply device 260. The power supply device 260 may supply electricity to the piezoelectric material layer 230. The power supply device 260 may supply electricity at any suitable frequencies so that the piezoelectric material layer 230 generates a corresponding vibration. FIG. 2 illustrates the electrical-connection relation between the power supply device 260 and the piezoelectric material layer 230. The spatial relation between the power supply device 260 and other devices of the panel structure 200 is not limited to that shown in FIG. 2. The power supply device 260 may be disposed at any suitable position.

The panel structure 200 only has a single piezoelectric material layer 230 in some embodiments. In other words, the piezoelectric material layer 230 serves as the functions of both generating and receiving ultrasonic waves while operating as the fingerprint recognition device. When electric power is supplied to the piezoelectric material layer 230, the piezoelectric material layer 230 generates the ultrasonic waves. The ultrasonic waves are transmitted to a user's finger through the cover plate 210. Thereafter, the ultrasonic waves are reflected back from the user's finger to the piezoelectric material layer 230 through the cover plate 210, and the piezoelectric material layer 230 receives the reflected ultrasonic waves to generate corresponding electric signals, which are used in the subsequent procedures of the fingerprint recognition.

In a first time interval, the piezoelectric material layer 230 is powered to vibrate and produces ultrasonic waves; thereafter, the piezoelectric material layer 230 is powered off and changed to detection mode. In a second time interval after the first time interval, the piezoelectric material layer 230 receives the reflected ultrasonic waves, and the reflected ultrasonic waves make the piezoelectric material layer 230 produce electric signal. The electric signal is transmitted to the thin-film transistor 240 for analysis.

In some embodiments, the above-mentioned operations for fingerprint recognition include a plurality of scan operations. A single scan operation scans only a portion of the fingerprint recognition area 110. Each scan operation scans a different portion of the fingerprint recognition area 110. Thus, the whole fingerprint recognition area 110 may be completely scanned by performing multiple scan operations.

In some embodiments, the panel structure 200 may include an ink layer 220. The ink layer 220 is disposed between the cover plate 210 and the piezoelectric material layer 230, so that the piezoelectric material layer 230 and the thin-film transistor 240 are not easy to be observed by the users. Therefore, the appearance of the panel structure 200 is pleasing to the eye. In an embodiment, the ink layer 220 is entirely opaque and completely covers the piezoelectric material layer 230. In other embodiments, the ink layer 220 may be a decorative film pasted on the bottom surface of the cover plate 210.

In certain embodiments, the panel structure 200 may include a substrate 250. The substrate 250 is disposed under the thin-film transistor 240. When the piezoelectric material layer 230 is operated as the earpiece, the volume of the voice generated by the vibration of the piezoelectric material layer 230 may be too small, so that the generated voice has to be amplified by a resonating structure nearby. Therefore, the substrate 250 is not only the substrate of the smart phone but also a resonating substance mentioned above. In some embodiments, the material of the substrate 250 may be aluminum, plastic, iron or glass.

The present disclosure provides another embodiment. Please refer to FIG. 3, which depicts a cross-sectional view illustrating a panel structure 300 of the fingerprint recognition area 120 along a line B-B' in FIG. 1. The panel structure 300 includes a cover plate 310, a piezoelectric material layer 340 and a thin-film transistor 350. The cover plate 310 is disposed over the piezoelectric material layer 340, and the piezoelectric material layer 340 is disposed on the thin-film transistor 350.

Similar to the piezoelectric material layer 230, the piezoelectric material layer 340 may generate the ultrasonic waves or the sound waves that human can recognize, in which the ultrasonic waves generated from the piezoelectric material layer 340 are used for the fingerprint recognition. The thin-film transistor 350 is electrically connected to the piezoelectric material layer 340. The thin-film transistor 350 analyzes the received signal while the piezoelectric material layer 340 is operating as the fingerprint recognition device.

The panel structure 300 only has a single piezoelectric material layer 340 in some embodiments. In other words, the piezoelectric material layer 340 servers as the functions of both generating and receiving ultrasonic waves while operating as the fingerprint recognition device. In a first time interval, the piezoelectric material layer 340 is powered to vibrate and produces ultrasonic waves; thereafter, the piezoelectric material layer 340 is powered off and changed to detection mode. In a second time interval after the first time interval, the piezoelectric material layer 340 receives the reflected ultrasonic waves, and the reflected ultrasonic waves make the piezoelectric material layer 340 produce electric signal. The electric signal is transmitted to the thin-film transistor 350 for analysis.

In certain embodiments, when the piezoelectric material layer 340 is operating as the fingerprint recognition device, the scan operations are similar to that of the piezoelectric material layer 230. A single scan operation scans only a portion of the fingerprint recognition area 120. Each scan operation scans a different portion of the fingerprint recognition area 110. Thus, the whole fingerprint recognition area 120 may be completely scanned by performing multiple scan operations.

In certain embodiments, the panel structure 300 includes a display layer 330 disposed between the cover plate 310 and the piezoelectric material layer 340. The display layer 330 may be organic light-emitting diode (OLED).

In some embodiments, the panel structure 300 includes a black matrix layer 320 disposed between the cover plate 310 and the display layer 330. The black matrix layer 320 is an optional structure, thus the panel structure 300 may not include the black matrix layer 320. The black matrix layer 320 may avoid the reflection of the external light from the reflective structure in the display layer 330, so that the user experience may be improved when watching the displayed image of the display layer 330. Besides, the black matrix layer 320 may also enhance the contrast and improve the quality of the display layer 330. The black matrix layer 320 is different from the ink layer 220. The black matrix layer 320 is partially opaque. The black matrix layer 320 may include a plurality of transparent areas corresponding to the pixels of the display layer 330, so that the displayed image of the display layer 330 can be observed by the users through the black matrix layer 320.

Figure 3:
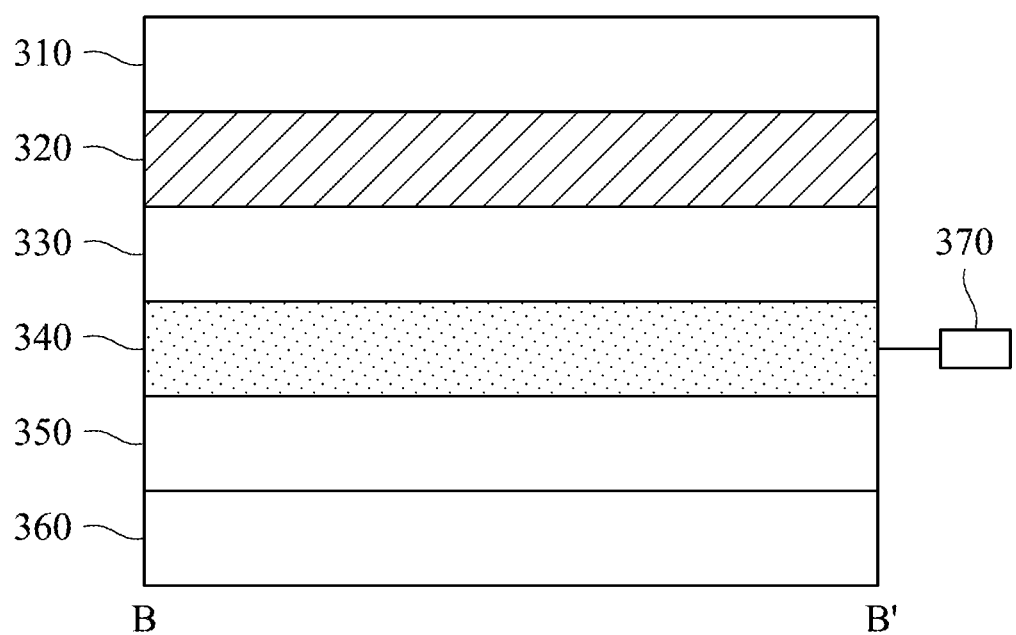
FIG. 3 is a cross-sectional view illustrating a panel structure 300 of the fingerprint recognition area 120 along a line B-B' in FIG. 1.

In some embodiments, the panel structure 300 further includes a power supply device 370 electrically connected to the piezoelectric material layer 340. When the piezoelectric material layer 340 is operating as the fingerprint recognition device, the power supply device 370 supplies the power that the piezoelectric material layer 340 needs for generating the ultrasonic waves. Similar to the power supply device 260, the power supply device 370 may supply electricity at any suitable frequencies so that the piezoelectric material layer 340 generates a corresponding vibration. FIG. 3 illustrates the electrical-connection relation between the power supply device 370 and the piezoelectric material layer 340. The spatial relation between the power supply device 370 and other devices of the panel structure 300 is not limited to that shown in FIG. 3. The power supply device 370 may be disposed at any suitable position.

In certain embodiments, the panel structure 300 may include a substrate 360 disposed under the thin-film transistor 350. When the piezoelectric material layer 340 is operated as the earpiece, the volume of the voice generated by the vibration of the piezoelectric material layer 340 may be too small, so that the generated voice has to be amplified by a resonating structure nearby Therefore, the substrate 360 is not only the substrate of the smart phone but also a resonating substance mentioned above. In some embodiments, the material of the substrate 360 may be aluminum, plastic, iron or glass.

When the user intends to answer a call, a processor of the smart phone would change the function of the piezoelectric material layer to the earpiece mode. The piezoelectric material layer receives the signal and converts the signal to mechanical energy in a form of vibration. When the vibration is at the human audible frequency, such as 20 Hz to 20,000 Hz, the piezoelectric material layer may generate the sound waves that human can recognize. When the user's finger touches the fingerprint recognition area, the processor of the smart phone would change the function of the piezoelectric material layer to the fingerprint recognition mode. The piezoelectric material layer vibrates at the frequency greater than 20,000 Hz to generate ultrasonic waves.

The present disclosure provides the panel structure able to operate as the earpiece and the fingerprint recognition device, in which a single piezoelectric material layer provides two different functions. The volume of the devices in the smart phone is drastically decreased by using one piezoelectric material layer. In turn, the width of the non-display area is decreased to meet the demand for narrow border phones.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A panel structure, comprising:
 a cover plate;
 a piezoelectric material layer disposed under the cover plate, wherein the piezoelectric material layer generates a vibration at a human audible frequency in a first time interval to generate a sound wave that human can recognize, and generates a vibration at a ultrasonic frequency in a second time interval to generate a ultrasonic wave, and the piezoelectric material layer is used for recognizing human fingerprint when vibrating at the ultrasonic frequency; and
 a thin-film transistor disposed under the piezoelectric material layer, wherein the thin-film transistor is electrically connected to the piezoelectric material layer.

2. The panel structure of claim 1, further comprising an ink layer disposed between the cover plate and the piezoelectric material layer.

3. The panel structure of claim 1, further comprising a display layer disposed between the cover plate and the piezoelectric material layer.

4. The panel structure of claim 3, wherein the display layer is an organic light-emitting diode.

5. The panel structure of claim 3, further comprising a black matrix layer disposed between the display layer and the cover plate.

6. The panel structure of claim 1, further comprising a power supply device, wherein the power supply device supplies an electric power to the piezoelectric material layer.

7. The panel structure of claim 6, wherein the power supply device is an alternating-current power supply device.

8. The panel structure of claim 7, wherein a frequency of the electric power is equal to the human audible frequency or the ultrasonic frequency.

9. The panel structure of claim 1, further comprising a substrate, wherein the cover plate, the piezoelectric material layer and the thin-film transistor are disposed on the substrate.

10. The panel structure of claim 1, wherein when the piezoelectric material layer vibrates at the ultrasonic frequency, the piezoelectric material layer is configured to be an emitter and a receiver of the ultrasonic wave.

* * * * *